(12) United States Patent
Yang et al.

(10) Patent No.: US 8,745,439 B2
(45) Date of Patent: Jun. 3, 2014

(54) SYSTEMS AND METHODS FOR MULTILEVEL MEDIA DEFECT DETECTION

(75) Inventors: Shaohua Yang, Santa Clara, CA (US); Weijun Tan, Longmont, CO (US); Yuan Xing Lee, San Jose, CA (US)

(73) Assignee: LSI Corporation, San Jose, CA (US)

( * ) Notice: Subject to any disclaimer, the term of this patent is extended or adjusted under 35 U.S.C. 154(b) by 1377 days.

(21) Appl. No.: 12/425,626

(22) Filed: Apr. 17, 2009

(65) Prior Publication Data
US 2010/0269023 A1 Oct. 21, 2010

(51) Int. Cl.
*G06F 11/10* (2006.01)

(52) U.S. Cl.
USPC ........................ 714/6.11; 714/6.13; 369/47.14

(58) Field of Classification Search
USPC ........................ 714/6.1, 6.11, 6.13; 369/47.14
See application file for complete search history.

(56) References Cited

U.S. PATENT DOCUMENTS

| | | | |
|---|---|---|---|
| 6,052,804 A * | 4/2000 | Thowe et al. ................. | 714/710 |
| 6,065,149 A | 5/2000 | Yamanaka | |
| 6,381,725 B1 * | 4/2002 | Isokawa ........................ | 714/769 |
| 6,442,117 B1 * | 8/2002 | Saiki et al. ................... | 369/47.3 |
| 6,691,263 B2 | 2/2004 | Vasic et al. | |
| 6,738,948 B2 | 5/2004 | Dinc et al. | |
| 6,920,005 B2 * | 7/2005 | Yun ................................ | 360/53 |
| 6,980,382 B2 | 12/2005 | Hirano et al. | |
| 7,154,936 B2 | 12/2006 | Bjerke et al. | |
| 7,168,030 B2 | 1/2007 | Aryoshi | |
| 7,203,015 B2 | 4/2007 | Sakai et al. | |
| 7,237,173 B2 * | 6/2007 | Morita et al. ................. | 714/755 |
| 7,254,192 B2 | 8/2007 | Onggosanusi | |
| 7,257,172 B2 | 8/2007 | Okamoto et al. | |
| 7,359,313 B2 | 4/2008 | Chan et al. | |
| 7,441,174 B2 | 10/2008 | Li et al. | |
| 7,451,344 B1 * | 11/2008 | Rothberg ....................... | 714/6.1 |
| 7,688,915 B2 | 3/2010 | Tanrikulu et al. | |
| 8,032,782 B2 * | 10/2011 | He et al. ......................... | 714/6.1 |
| 8,453,039 B2 * | 5/2013 | Tan ................................ | 714/795 |
| 2003/0063405 A1 | 4/2003 | Jin et al. | |
| 2006/0107182 A1 * | 5/2006 | Cideciyan et al. ............ | 714/758 |
| 2007/0061687 A1 * | 3/2007 | Hwang ........................ | 714/780 |
| 2009/0235116 A1 | 9/2009 | Tan et al. | |
| 2009/0235146 A1 | 9/2009 | Tan et al. | |
| 2009/0268575 A1 * | 10/2009 | Tan et al. .................... | 369/53.41 |
| 2009/0268848 A1 | 10/2009 | Tan et al. | |
| 2009/0271670 A1 | 10/2009 | Tan et al. | |
| 2010/0042877 A1 | 2/2010 | Tan | |
| 2010/0074078 A1 * | 3/2010 | Cao et al. .................... | 369/53.17 |

OTHER PUBLICATIONS

Erasure decoding in Burst-Error Channels by Leung and Welch Published Mar. 1981 http://ieeexplore.ieee.org/stamp/stamp.jsp?arnumber=01056326.*
U.S. Appl. No. 12/399,679, filed Mar. 2009, Dziak, Scott.
U.S. Appl. No. 12/399,713, filed Mar. 2009, Weijun Tan.
U.S. Appl. No. 12/399,750, filed Mar. 2009, Weijun Tan.
U.S. Appl. No. 12/425,824, filed Apr. 2009, Shaohua Yang.
Kavcic et al., "A Signal-Dependent Autoregressive Channel Model", IEEE Transactions on Magnetics, vol. 35, No. 5, Sep. 1999 pp. 2316-2318.

* cited by examiner

*Primary Examiner* — Joseph Schell
(74) *Attorney, Agent, or Firm* — Hamilton DeSanctis & Cha

(57) ABSTRACT

Various embodiments of the present invention provide systems and methods for deriving data from a defective media region. As an example, a method for deriving data from a defective media region is disclosed that includes providing a storage medium and performing a media defect detection that indicates a defective region on the storage medium. A first data decode is performed on data corresponding to the defective region. The first data decode yields a first output. It is determined that the first output failed to converge and based at least in part on the failure of the first output to converge, a second data decode is performed on the data corresponding to the defective region. The second data decode includes zeroing out any soft data corresponding to the defective region and providing a second output.

23 Claims, 8 Drawing Sheets

SYSTEMS AND METHODS FOR MULTILEVEL MEDIA DEFECT DETECTION

BACKGROUND OF THE INVENTION

The present invention is related to storage media. More particularly, the present invention is related to systems and methods for identifying defective regions on a storage medium.

A typical storage medium includes a number of storage locations where data may be stored. Data is written to the medium within areas designated for user data by positioning a read/write head assembly over the medium at a particular location, and subsequently passing a modulated electric current through the head assembly such that a corresponding magnetic flux pattern is induced in the storage medium. To retrieve the stored data, the head assembly is positioned over a track containing the desired information and advanced until it is over the desired data. In this position, the previously stored magnetic flux pattern operates to induce a current in the head assembly. This induced current may then be converted to represent the originally recorded data.

The storage locations on the storage medium are typically arranged as a serial pattern along concentric circles known as tracks. FIG. 1 shows a storage medium 100 with two exemplary tracks 150,155 indicated as dashed lines and written respective distances from an outer perimeter 140. The tracks are segregated by servo data written within wedges 160, 165. These wedges include data and supporting bit patterns that are used for control and synchronization of the head assembly over a desired storage location on storage medium 100. In particular, such wedges traditionally include a preamble pattern 152 followed by a single sector address mark (SAM) 154 as shown by element 110. The SAM 154 is followed by a Gray code 156, and the Gray code 156 is followed by burst information 158. It should be noted that while two tracks and two wedges are shown, hundreds of each would typically be included on a given storage medium. Further, it should be noted that a sector may have two or more bursts.

Manufacturing the storage medium includes performing a variety of steps any of which can result in a defective region on the storage medium. Further, defective regions may develop over the time that the storage medium is used. Writing data to a defective region can result in the loss of such data. To avoid this, some approaches have been developed to identify defective regions as unusable. This works reasonably well, but does not identify regions that become defective over time and does not always identify all defective regions. In such cases, such an approach is not effective.

Hence, for at least the aforementioned reasons, there exists a need in the art for advanced systems and methods for identifying defective regions on a storage medium.

BRIEF SUMMARY OF THE INVENTION

The present invention is related to storage media. More particularly, the present invention is related to systems and methods for identifying defective regions on a storage medium.

Various embodiments of the present invention provide methods for deriving data from a defective media region. Such methods include providing a storage medium and performing a media defect detection that indicates a defective region on the storage medium. A first data decode is performed on data corresponding to the defective region. The first data decode yields a first output. It is determined that the first output failed to converge and based at least in part on the failure of the first output to converge, a second data decode is performed on the data corresponding to the defective region. The second data decode includes zeroing out any soft data corresponding to the defective region and providing a second output.

Upon determining that the second output failed to converge, some instances of the aforementioned embodiments include performing a third data decode on the data corresponding to the defective region. The third data decode includes using data regenerated from data corresponding to the defective region and providing a third output. Where it is determined that the third output failed to converge, some instances of the aforementioned embodiments further include performing an offline detection and decode process to recover the data corresponding to the defective region.

In one or more cases, the offline detection and decode process may include modifying one or more parameters associated with performing the media defect detection, and performing a fourth data decode on the data corresponding to the defective region using the modified parameters. In some cases, the fourth data decode includes zeroing out any soft data corresponding to the defective region. In other cases, the fourth data decode includes using data regenerated from data corresponding to the defective region. The parameters associated with performing the media defect detection may be, but are not limited to, a defect amplitude threshold, a run length threshold, a left extension value and a right extension value.

In various cases, the offline detection and decode process includes modifying one or more parameters associated with performing the third data decode, and performing a fourth data decode on the data corresponding to the defective region using the modified parameters. The parameters associated with performing the third data decode may include, but are not limited to, an attenuation factor and a programmable scalar. In various cases, the fourth data decode includes zeroing out any soft data corresponding to the defective region, and/or using data regenerated from data corresponding to the defective region.

Other embodiments of the present invention provide methods for deriving data from a defective media region. Such methods include providing a storage medium and performing a media defect detection that indicates a defective region on the storage medium. A first data decode is performed on data corresponding to the defective region. The first data decode includes zeroing out any soft data corresponding to the defective region and providing a first output. It is determined that the first output failed to converge. Based at least in part on the failure of the first output to converge, a second data decode is performed on the data corresponding to the defective region. The second data decode includes regenerating data corresponding to the defective region and providing a second output.

In some cases, the methods further include determining that the second output failed to converge. Based at least in part on the failure of the second output to converge, an offline detection and decode process is performed to recover the data corresponding to the defective region. In one or more cases, the offline detection and decode process may include modifying one or more parameters associated with performing the media defect detection, and performing a fourth data decode on the data corresponding to the defective region using the modified parameters. In some cases, the fourth data decode includes zeroing out any soft data corresponding to the defective region. In other cases, the fourth data decode includes using data regenerated from data corresponding to the defective region. The parameters associated with performing the media defect detection may be, but are not limited to, a defect amplitude threshold, a run length threshold, a left extension value and a right extension value.

In various cases, the offline detection and decode process includes modifying one or more parameters associated with performing the first data decode, and performing a third data decode on the data corresponding to the defective region using the modified parameters. The parameters associated with performing the third data decode may include, but are not limited to, an attenuation factor and a programmable scalar. In various cases, the third data decode includes zeroing out any soft data corresponding to the defective region, and/or using data regenerated from data corresponding to the defective region.

In one or more instances of the aforementioned embodiments, the methods further include performing a third data decode on data corresponding to the defective region, wherein the third data decode yields a third output. It is determined that the third output failed to converge. Based upon this, the first data decode is done at least in part based upon the failure of the third output to converge.

Yet other embodiments of the present invention provide methods for deriving data from a defective media region that include providing a storage medium and performing a media defect detection that indicates a defective region on the storage medium. A first data decode is performed on data corresponding to the defective region. The first data decode includes regenerating data corresponding to the defective region and providing a first output. It is determined that the first output failed to converge. Based at least in part on the failure of the first output to converge, an offline detection and decode process is performed to recover the data corresponding to the defective region. In some instances of the aforementioned embodiments, the methods further include performing a second data decode on data corresponding to the defective region. The second data decode yields a second output. Performing the first data decode is done at least in part based upon a failure of the second output to converge. In some of the aforementioned embodiments, the second data decode includes zeroing out any soft data corresponding to the defective region.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to storage media. More particularly, the present invention is related to systems and methods for identifying defective regions on a storage medium.

Figure 1:
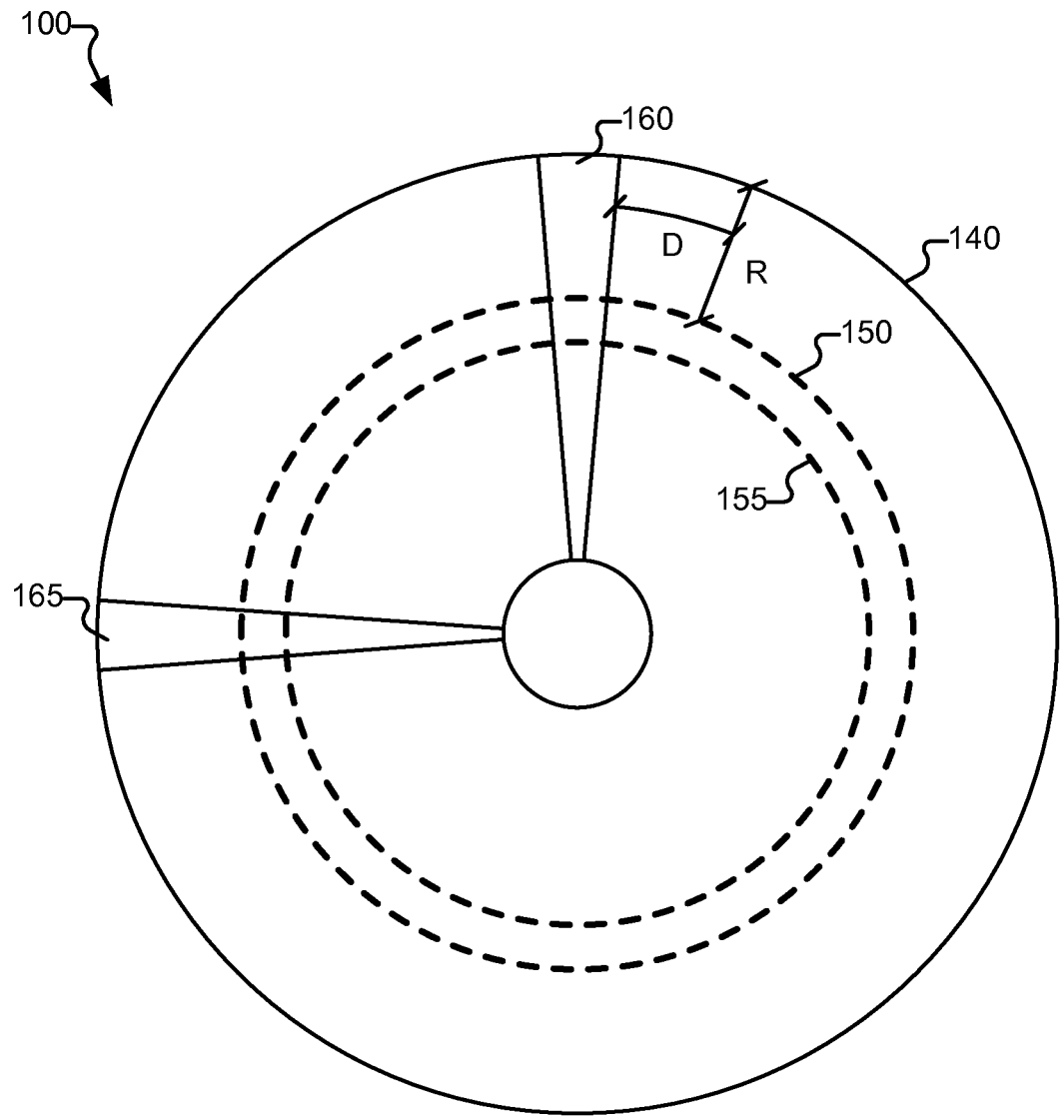
FIG. 1 depicts a known storage medium layout.
Figure 1:
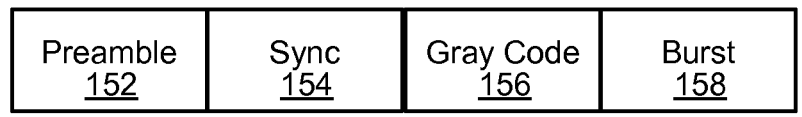
Figure 2:
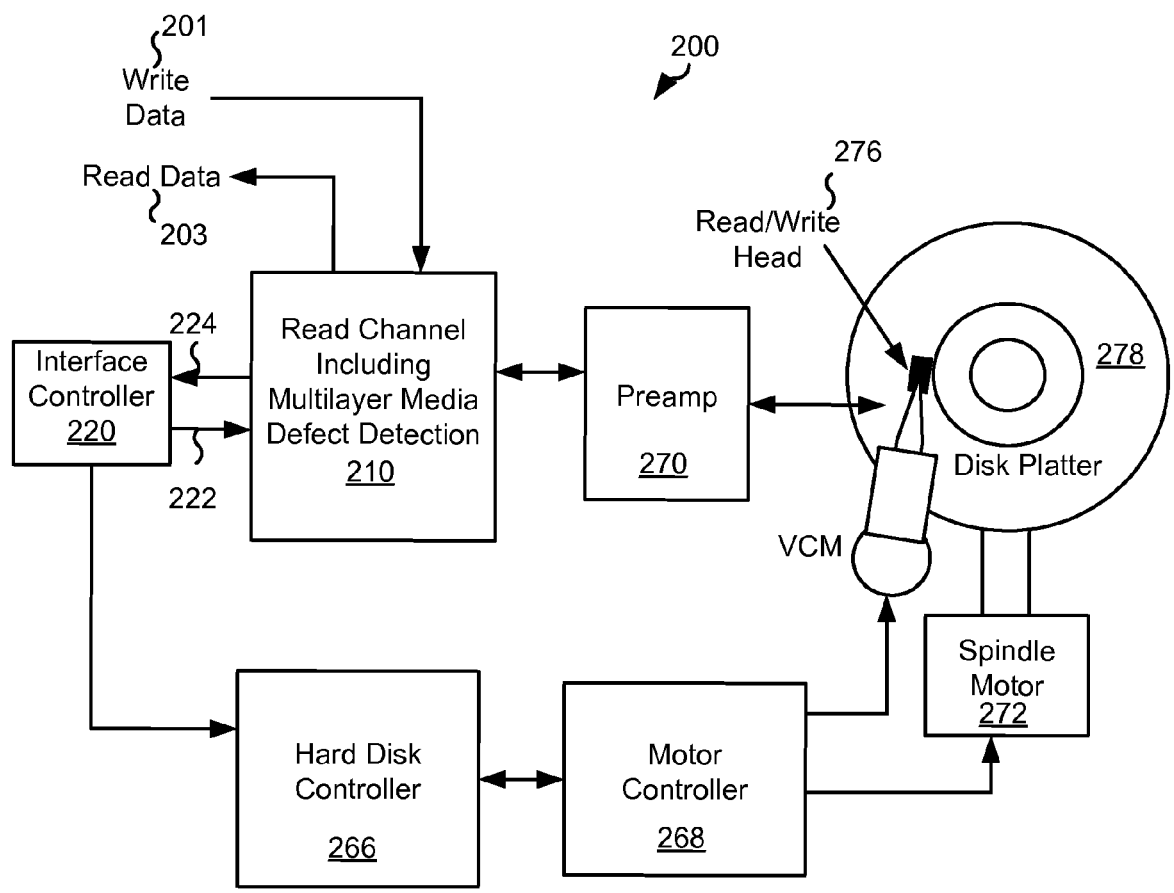
FIG. 2 is a storage system including a multilevel media defect detection system in accordance with one or more embodiments of the present invention.

Turning to FIG. 2, a storage system 200 including a multilevel media defect system is shown in accordance with various embodiments of the present invention. Storage system 200 may be, for example, a hard disk drive. Storage system 200 includes a read channel 210 with a multilevel media defect detector. The incorporated multilevel media defect detector may be any multiple approach media defect detector capable of determining a media defect based on a series of pre-processed digital samples (i.e., samples that have not been processed through a data detector). Exemplary embodiments of such a multilevel media defect detector are discussed herein.

In addition to read channel 210, storage system 200 includes an interface controller 220, a preamp 270, a hard disk controller 266, a motor controller 268, a spindle motor 272, a disk platter 278, and a read/write head assembly 276. Interface controller 220 controls addressing and timing of data to/from disk platter 278. The data on disk platter 278 consists of groups of magnetic signals that may be detected by read/write head assembly 276 when the assembly is properly positioned over disk platter 278. In a typical read operation, read/write head assembly 276 is accurately positioned by motor controller 268 over a desired data track on disk platter 278. Motor controller 268 both positions read/write head assembly 276 in relation to disk platter 278 and drives spindle motor 272 by moving read/write head assembly to the proper data track on disk platter 278 under the direction of hard disk controller 266. Spindle motor 272 spins disk platter 278 at a determined spin rate (RPMs).

Once read/write head assembly 278 is positioned adjacent the proper data track, magnetic signals representing data on disk platter 278 are sensed by read/write head assembly 276 as disk platter 278 is rotated by spindle motor 272. The sensed magnetic signals are provided as a continuous, minute analog signal representative of the magnetic data on disk platter 278. This minute analog signal is transferred from read/write head assembly 276 to read channel module 264 via preamp 270. Preamp 270 is operable to amplify the minute analog signals accessed from disk platter 278. In addition, preamp 270 is operable to amplify data from read channel module 210 that is destined to be written to disk platter 278. In turn, read channel module 210 decodes (including media defect detection) and digitizes the received analog signal to recreate the information originally written to disk platter 278. This data is provided as read data 203 to a receiving circuit. A write operation is substantially the opposite of the preceding read operation with write data 201 being provided to read channel module 210. This data is then encoded and written to disk platter 278.

Figure 3:
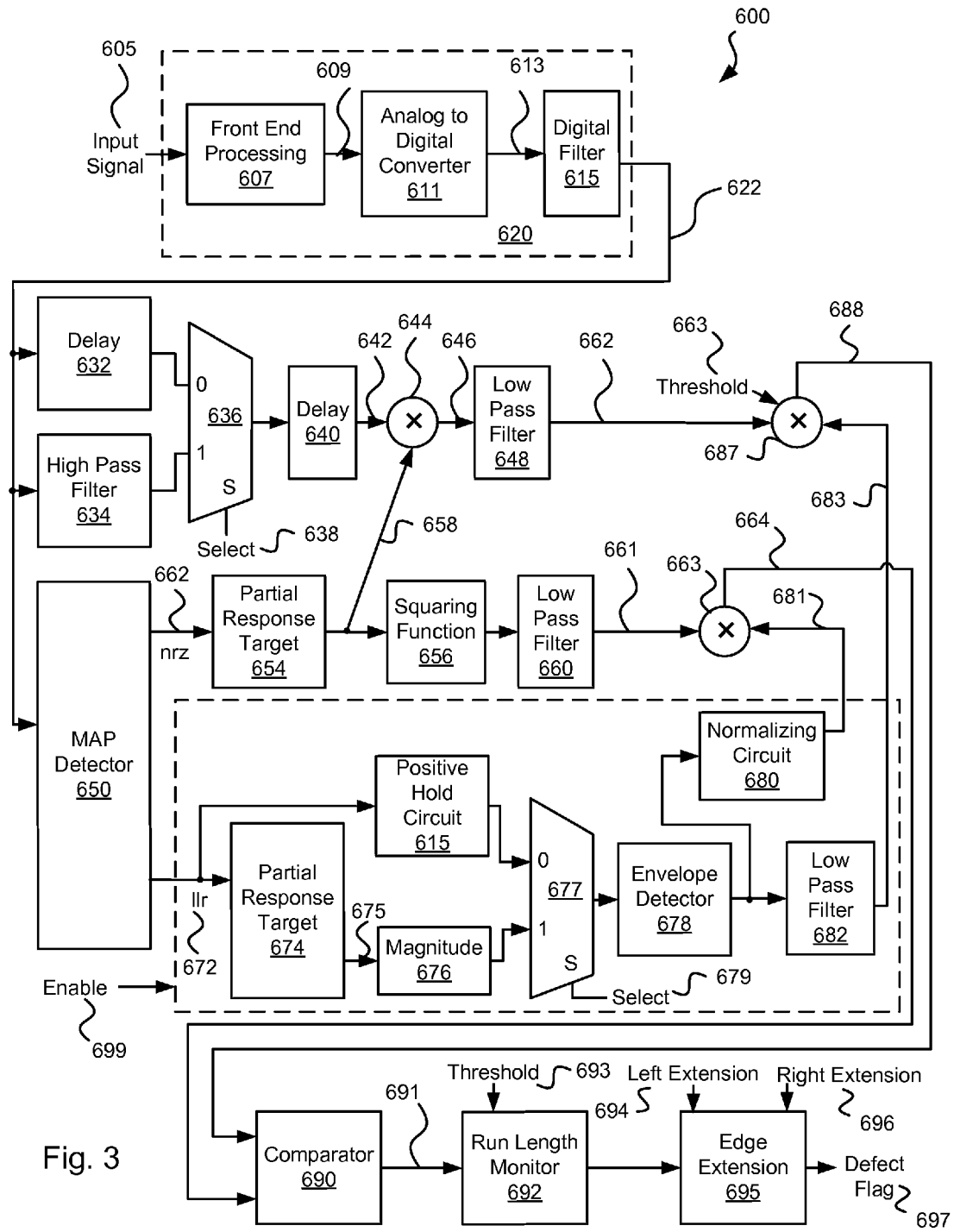
FIG. 3 depicts a media defect detector that may be used in accordance with some embodiments of the present invention.

FIG. 3 depicts a media defect detector 600 that may be used in relation to different embodiments of the present invention. Media defect detector 600 includes an input circuit 620 that is responsible for receiving and sampling a data input 605. Data input 605 is provided by a read/write head assembly (not shown) disposed in relation to a storage medium (not shown). Input circuit 620 includes a front end processing circuit 607 that applies, among other things, amplification and/or analog filtering to input signal 605 and provides an analog signal 609 to an analog to digital converter 611. Analog to digital converter 611 samples analog signal 609 at a sampling rate and provides a series of digital samples 613. Analog to digital converter 611 may be any circuit known in the art that is capable of converting an analog signal to a series of digital samples. Digital samples 613 are filtered using a digital filter 615 that provides data samples 622. In some cases, digital filter 615 is a ten tap digital finite impulse response filter as is known in the art. Based upon the disclosure provided herein, one of ordinary skill in the art will recognize a variety digital filters that may be used in relation to different embodiments of the present invention.

Data samples 622 are provided in parallel to a delay circuit 632, a high pass filter 634, and a MAP data detector 650. MAP data detector 650 performs a maximum a posteriori data detection on data samples 622 as is known in the art. This data detection process produces both a hard output (nrz) 652 and a soft output (llr) 672. Hard output 652 is a series of determined values for each bit period of the input bit stream, and the corresponding soft output 672 indicates a likelihood that the respective hard output 652 is correctly determined. In some embodiments of the present invention, hard output 652 is either a 'positive 1' or a 'negative 1', and soft output 672 is a log-likelihood ratio representing the probability that the corresponding hard output 652 is accurate. In one case, soft output 672 is a value between negative thirty-two and positive thirty-two with the lowest value corresponding to the lowest probability and the highest value corresponding to the highest probability.

Hard output 652 is provided to a partial response target filter 654. Partial response target filter 654 provides a partial response output 658 to a squaring function 656. In some cases, partial response target filter 654 is a two tap digital finite impulse response filter as is known in the art. Partial response output 658 is provided to a squaring function 656 to create a squared output (i.e., $f(x)=x^2$). The squared output is provided to a low pass filter 660 that filters the received input and provides a filtered output 661. Low pass filter 660 may be any low pass filter known in the art. In one particular embodiment, low pass filter 660 is a thirty-two bit MA filter as are known in the art. In addition, partial response output 658 is provided to a multiplier circuit 644.

Soft output 672 is provided to a partial response target filter 674 and to a positive hold circuit 615. Positive hold circuit 615 may be used to yield a magnitude value in accordance with the following pseudocode:

If ($input_i >= 0$){
    Output = $input_i$ }
Else {
    Output = $input_{i-1}$ }, where $input_i$ is the current soft output 672, $input_{i-1}$ is the preceding soft output 672, and output is the output provided by positive hold circuit 615. The output of positive hold circuit 615 is provided to a multiplexer 677. In some cases, partial response target filter 674 is a two tap digital finite impulse response filter as is known in the art. Based upon the disclosure provided herein, one of ordinary skill in the art will recognize other partial response target filters that may be used in relation to different embodiments of the present invention. A partial response output 675 from partial response target filter 674 is provided to a magnitude function 676. Magnitude function 676 returns the absolute value of partial response output 675, and the magnitude is provided to multiplexer 677. Depending upon the assertion level of a select input 679, multiplexer 677 provides either the magnitude output from magnitude function 676 or the output of positive hold circuit 615 to an envelope detector 678. Envelope detector 678 may be any envelope detector known in the art. In one particular embodiment of the present invention, envelope detector 678 operates in accordance with the following pseudocode:

If ($input_i > input_{i-1}$){
    output = $input_i$
}
Else{
    output = $input_i$ − envelope decay
}, where $input_i$ is the current output from multiplexer 677, $input_{i-1}$ is the preceding output from multiplexer 677, and envelope decay is a programmable decay value used by envelope detector 678. The resulting output of envelope detector 678 is provided to a low pass filter 682 that provides a filtered output 683.

The output of envelope detector 678 is provided to a normalizing circuit 680. Normalizing circuit 680 operates to normalize the output of envelope detector 678 to one. A normalized output 681 from normalizing circuit 680 provides a probability where one is equivalent to a high probability and other values down to zero correspond to respectively lower probabilities. Normalized output 681 is provided along with filtered output 661 to a multiplier 663. A multiplication product 664 from multiplier 663 is filtered output 661 attenuated by the probability value represented by normalized output 681.

Data samples 622 are provided in parallel to a delay circuit 632 and a high pass filter 634. In some embodiments of the present invention, high pass filter 634 is a (1—thirty-two bit) MA filter as are known in the art. Based upon the disclosure provided herein, one of ordinary skill in the art will recognize a variety of high pass filters that may be used in relation to different embodiments of the present invention. Delay circuit 632 delays the received signal by a time period corresponding to the time required to pass through high pass filter 634. A multiplexer 636 selects either the output of high pass filter 634 or the output of delay circuit 632 based upon a select input 638. The selected output from multiplexer 636 is provided to a delay circuit 640. Delay circuit 640 provides a delayed output 642 that is delayed in time by an amount corresponding to the time used by MAP detector circuit 650 and a partial response target filter 654. Said another way, delay circuit 640 operates to align delayed output 642 with partial response output 658 (i.e., to assure that each output is derived from the same data samples 622). Multiplier circuit 644 multiplies delayed output 642 by partial response output 658 to yield a multiplication product output 646. Product output 646 is provided to a low pass filter 648 that in turn provides a low pass filtered signal 662.

Low pass filtered signal 662, filtered output 683 and a threshold value 663 are multiplied by a multiplier circuit 687 to provide a multiplication product 688 in accordance with the following equation:

Multiplication Product 688=(Threshold 663)*(Low Pass Filtered Signal 662)*(Filtered Output 683).

Multiplication product 688 is compared with a multiplication product 664 using a comparator 690. Where multiplication product 688 is less than multiplication product 664, a defect signal 691 is asserted to indicate a media defect is found. Otherwise, no media defect is found.

Defect signal 691 is provided to a run length monitor circuit 692 that requires assertion of defect signal 691 for a programmable threshold number 693 of cycles before a defect is indicated. Once a defect is indicated by run length monitor 692, an edge extension circuit 695 marks the beginning and end of a corresponding defective region using a programmable right extension value 694 and a programmable left extension value 696. Run length monitor 692 and edge extender circuit 695 may be implemented similar to that disclosed in U.S. patent application Ser. No. 12/111,255 entitled "Systems and Methods for Media Defect Detection Utilizing Correlated DFIR and LLR Data", and filed Apr. 29, 2008 by Tan et al. The entirety of the aforementioned reference is incorporated herein by reference for all purposes.

Figure 4:
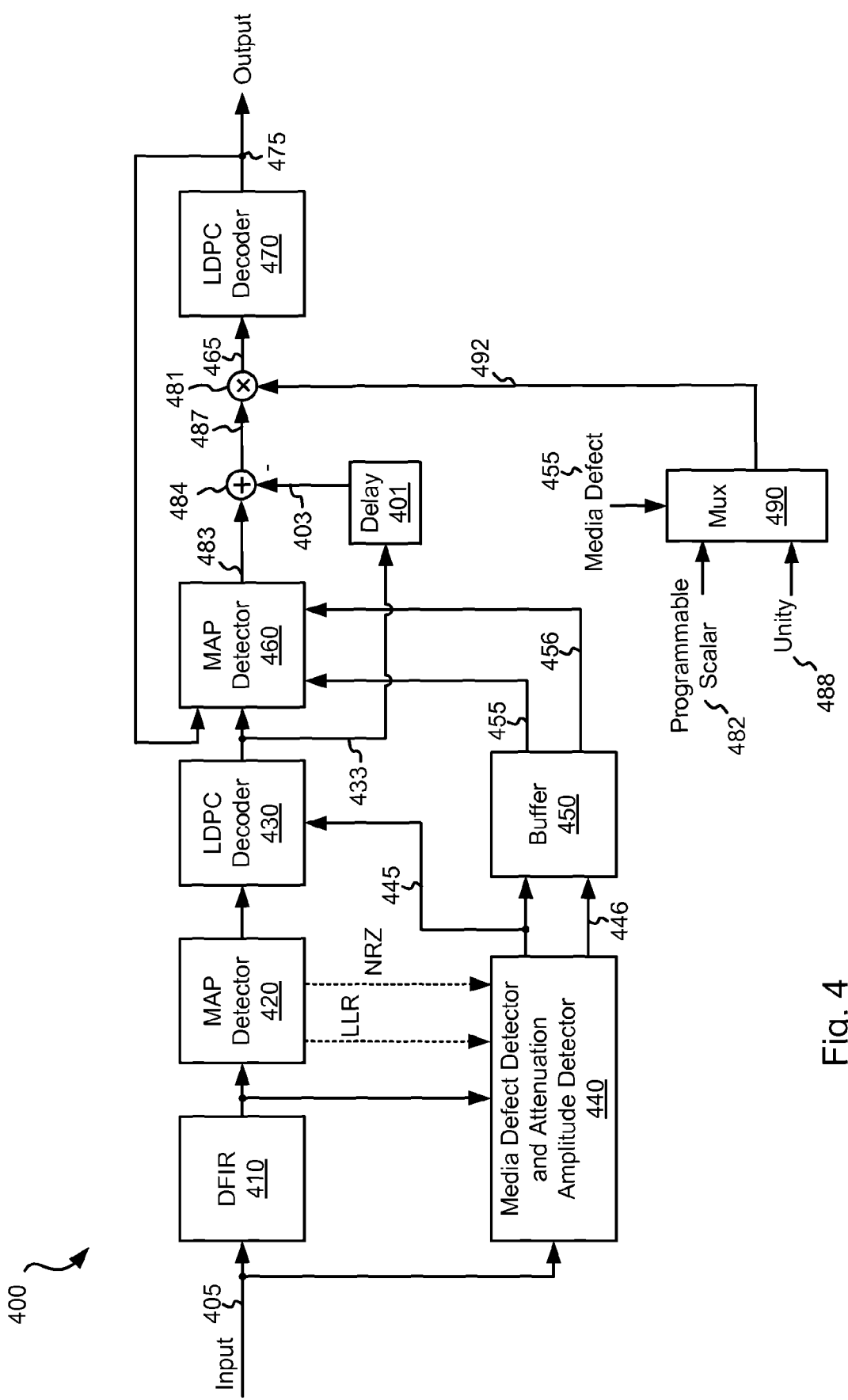
FIG. 4 depicts a media defect detector including a data recovery system in accordance with various embodiments of the present invention.

FIG. 4 depicts a media defect detector including a data regeneration system 400 in accordance with various embodiments of the present invention. Data regeneration system 400 receives an input 405 that is provided to both a digital FIR filter 410 and a combination media defect detector and attenuation amplitude detector 440. Input 405 may be received via a particular medium (not shown). As an example, input 405 may be derived from a magnetic storage medium, a wireless link, a wired link or the like. Based on the disclosure provided herein one of ordinary skill in the art will recognize a variety of media from which input 405 may be derived. In some cases, input 405 may be amplified and/or converted from one domain to another (e.g., an analog to digital conversion) prior to being received by data regeneration system 400.

Combination media defect detector and attenuation amplitude detector 440 provides both a media defect output 445 and attenuation factors 446. Media defect output 445 is asserted whenever a possible media defect is identified. Combination media defect detector and attenuation amplitude detector 440 may include any media defect detector known in the art that is capable of determining the possibility of a media defect. Exemplary media defect detectors are disclosed in PCT Patent Application No. PCT/US07/80043 entitled "Systems and Methods for Media Defect Detection" and filed on Oct. 1, 2007 by Tan. The entirety of the aforementioned patent application is incorporated herein by reference for all purposes. It should be noted that other types a media defect detectors may be used in relation to the various embodiments of the present invention. In addition, media defect detector and attenuation amplitude detector 440 also includes an attenuation factor determination circuit. Such an attenuation factor determination circuit may be similar to that described in relation to FIG. 2 of U.S. patent application Ser. No. 12/399,750 entitled "Systems and Methods for Recovering Information from a Defective Medium" and filed by Fitzpatrick et al. on a date even herewith. The entirety of the aforementioned reference is incorporated herein by reference for all purposes.

The output of digital FIR filter 410 is provided to a combination media defect detector and attenuation amplitude detector 440. In addition, combination media defect detector and attenuation amplitude detector 440 receive or generate soft output information (LLR) and hard output information (nrz) that is based on the output from digital FIR filter 410. Combination media defect detector and attenuation amplitude detector 440 provides both a media defect output 445 and attenuation factors 446. Media defect output 445 is asserted whenever a possible media defect is identified. Combination media defect detector and attenuation amplitude detector 440 may include any media defect detector known in the art that is capable of determining the possibility of a media defect. Exemplary media defect detectors are disclosed in PCT Patent Application No. PCT/US07/80043 entitled "Systems and Methods for Media Defect Detection" and filed on Oct. 1, 2007 by Tan. The entirety of the aforementioned patent application is incorporated herein by reference for all purposes. It should be noted that other types a media defect detectors may be used in relation to the various embodiments of the present invention. In addition, media defect detector and attenuation amplitude detector 440 also includes an attenuation factor determination circuit. Such a circuit may be similar to that described in relation to FIG. 2 above. A buffer 450 receives media defect output 445 and attenuation factors 446 and provides corresponding time delayed media defect flag 455 attenuation factor 456.

The output of digital FIR filter 410 is provided to a MAP detector 420 that operates consistent with MAP detectors as are known in the art. A soft output from MAP detector 420 is provided to an LDPC decoder 430 as are known in the art. In contrast to general use of LDPC decoder 430, the soft input from MAP detector 420 provided as an input to LDPC decoder 430 may be nullified whenever media defect output 445 is asserted indicating that a media defect exists.

An extrinsic LLR output 433 of LDPC decoder 430 is provided to a subsequent MAP detector 460 that operates consistent with MAP detectors as are known in the art. In contrast to general use of LDPC decoder 430, the branch metric of MAP detector 460 is modified through a data regeneration process whenever a media defect flag 455 is asserted indicating that a media defect exists. The following pseudo-code represents the branch metric of MAP detector 460 where the value of η is a selected attenuation factor 456 designed to regenerate data derived from a defective media:

```
IF (Media Defect Flag 455 Indicates no Defect)
{
        Branch Metric = [f(X₃X₂X₁X₀)*y−IDEAL(X₃X₂X₁X₀)]²/N0 +
        Soft Input
}
ELSE IF (Transitional Period)
{
        Branch Metric = (1+alpha)(Soft Input)
}
ELSE (Media Defect Flag 655 Indicates a Defect)
{
        Branch Metric = [f(0000)*y−η·IDEAL'(X₃X₂X₁X₀)]²/N0 +
        Soft Input
}
```

Generation of the above mentioned branch metric values are described in greater detail in relation to FIGS. 4a-4b the previously incorporated US Patent Application entitled "Systems and Methods for Recovering Information from a Defective Medium" and filed by Fitzpatrick et al. on a date even herewith. It should be noted that other circuits and approaches for data recovery from defective regions of a storage medium may be used in accordance with various embodiments of the present invention. For example, the circuits and approaches disclosed in U.S. patent application Ser. No. 12/111,889 entitled "Systems and Methods for Reducing Attenuation of Information Derived from a Defective Medium" and filed Apr. 29, 2008 by Tan et al. The entirety of the aforementioned reference is incorporated herein by reference for all purposes. The notation * indicates a multiplication function in contrast to * that indicates a convolution or filtering function.

The transitional period is a time between a defective and non-defective region that may be considered too volatile to use for regenerating a data signal in accordance with the approaches discussed herein. In such cases, it may be that data regeneration is only performed in the middle of the window during which a media defect flag is asserted, and that during the transitional period the branch metric is set equal to (1+alpha)(Soft Input). This avoids data regeneration during the transition from a non-defective region to a defective region, and from a defective region to a non-defective region. Once the initial transitional period from non-defective region to defective region has passed, the process may convert to utilizing regenerated data. This process of using regenerated data could give way to a subsequent transitional period from the defective region to the non-defective region where (1+alpha)(Soft Input) is again used. Once the subsequent transitional period has passed, the process could return to using the standard data input for processing. Based on the disclosure provided herein, one of ordinary skill in the art will recognize a variety of other modifications that may be implemented in accordance with yet other embodiments of the present invention. For example, in different embodiments of the present invention, the aforementioned transitional periods may not be accounted for, in which case the preceding pseudo-code can be simplified.

An output 483 of MAP detector 460 is provided to an adder circuit 484. Adder circuit 484 subtracts an instant 403 of extrinsic LLR output 433 that is aligned with output 483 (a delay circuit 401 assures the alignment) from output 483 to yield an output 487. Output 487 is provided to a multiplier circuit 481 that multiplies it by a scalar value 492 provided by a multiplexer 490. When media defect flag 455 is asserted such that a media defect is indicated, a programmable scalar value 482 is provided as scalar value 492. Otherwise, a default unity value 488 is provided as scalar value 492. $X_3, X_2, X_1$ and $X_0$ are inputs of a branch within MAP detector 460, and y is the DFIR output that is used in the branch calculation within MAP detector 460.

An output 465 of multiplier circuit 481 is provided to an LDPC decoder 470 that provides decoded output 475. LDPC decoder 470 provides LDPC decoding as is known in the art. Decoded output 475 may be iteratively processed by being fed back to MAP detector 460 until convergence is accomplished.

Figure 5:
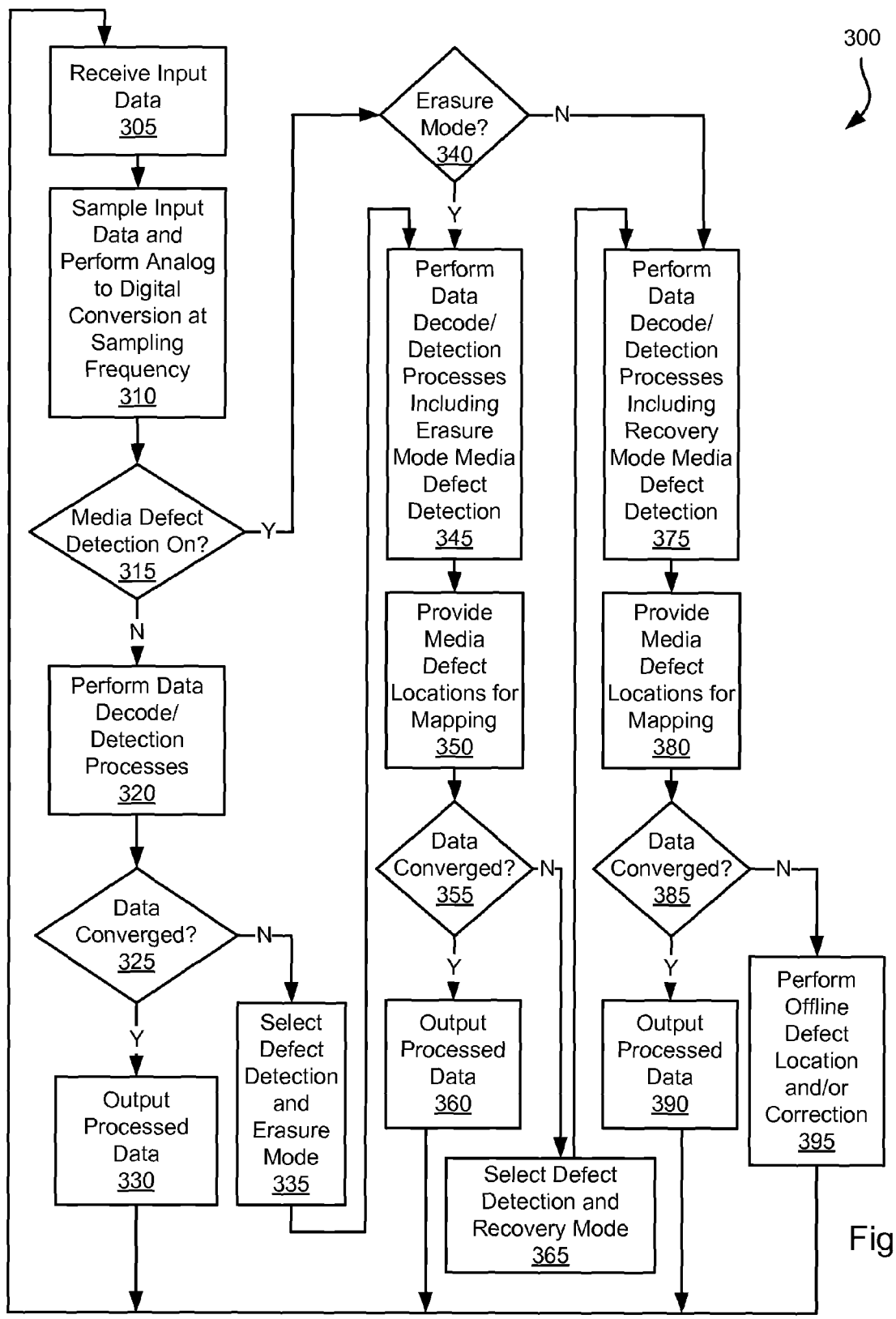
FIG. 5 is a flow diagram showing a multilevel defect detection and correction process in accordance with different embodiments of the present invention.

Turning to FIG. 5, a flow diagram 300 shows a multilevel defect detection process in accordance with different embodiments of the present invention. Following flow diagram 300, a data input is received (block 305). In some cases, the data input is derived from a storage medium. The data may be sensed using a read/write head assembly disposed in relation to the storage medium and processed using an analog front end circuit that includes, for example, an analog filter. The input data is sampled to convert it from the analog signal domain to the digital signal domain at a defined conversion frequency (block 310). It is then determined if media defect detection and/or data recovery is turned on (block 315).

Where media defect detection is not turned on (block 315), a data decode/detection process is performed (block 320). In some cases, the defective region on the storage medium is sufficiently small such that the data decode/detection process is capable of correcting any errors and regenerating the data corresponding to the defective region. As such, there is no need to operate the media defect system. It is determined whether the data decode/detection process results in a data convergence (block 325). Where the data does converge (block 325), the data decode/detection process succeeded in correcting any errors introduced due to a media defect or any other noise. As such, the resulting data is provided as an output (block 330). Alternatively, where the data failed to converge (block 325), erasure defect recovery is enabled (block 335).

Where media defect detection is turned on (block 315), it is determined whether erasure defect recovery is enabled (block 340). Where erasure defect recovery is enabled (block 340 or block 335), a data decode/detection process is performed with erasure mode media defect detection (block 345). Such a process operates to erase or nullify any data being introduced to the data decode/detection process whenever a media defect is detected. Any media defect detector known in the art may be used to provide an indication of a media defect. As one example, media defect detector 600 discussed above in relation to FIG. 3 may be used to perform media defect detection. In some cases, nullification is achieved by zeroing out any soft data corresponding to defective regions of a medium. Such nullification may be accomplished through use of any data processing system where the soft data provided to a downstream data detector can be zeroed out or nullified. As an example, data regeneration system 400 discussed above in relation to FIG. 4 may be used in this mode. In this case, the nullification may be accomplished by zeroing out any soft data from LDPC decoder 430 that is provided to MAP detector 460. Of note, in this mode data regeneration is not performed by MAP detector 460 using a modified branch metric as was discussed above, but rather a standard detection process is performed that does not include recreating data from a defective region. By doing so, data derived from defective regions is not allowed to impact the data decode/detection process. This gives the data decode/detection process another opportunity to correct any errors due to a defective medium or other noise.

In addition, any defective regions on the medium are provided for mapping (block 350). This allows for moving data away from defective regions, thus reducing the possibility of additional data loss. It is determined whether the data decode/detection process (block 345) results in a data convergence (block 355). Where the data does converge (block 355), the data decode/detection process including erasure defect recovery succeeded in correcting any errors introduced due to a media defect or any other noise. As such, the resulting data is provided as an output (block 360). Alternatively, where the data failed to converge (block 355), defect detection including data regeneration or recovery is enabled (block 365). It should be noted that in some cases only one or the other of erasure decoding or recovery decoding is used. In such a case where erasure decoding failed to converge (block 355), the process is transferred to block 395 which is discussed in more detail below.

Where erasure defect recovery is not enabled (block 340) or where defect detection including erasure mode decoding fails to converge (block 355), a data decode/detection process is performed with recovery mode media defect detection (block 375). Such a process operates to modify data derived from a defective region of a storage medium to recover at least an indication of the data derived from the defective region. Any media defect detector known in the art may be used to identify defective regions. As one example, media defect detector 600 discussed above in relation to FIG. 3 may be used to perform media defect detection. In some cases, the soft data associated with the defective region is reduced in magnitude to indicate an increased likelihood of errors with the data from that region, and/or the hard data from the defective region may be enhanced. Such data recovery and/or regeneration may be accomplished through use of any data processing system where the soft data and/or hard data provided to a downstream data detector is provided may be modified for further processing. As an example, data regeneration system 400 discussed above in relation to FIG. 4 may be used in this mode. In this case, the branch metrics of MAP detector 460 may be modified based upon the identification of defective regions on the storage medium as is more fully discussed above in relation to FIG. 4. By attempting to recover data derived from the defective region, the data decode/detection process has another opportunity to correct any errors due to a defective medium or other noise.

In addition, any defective regions on the medium are provided for mapping (block 380). This allows for moving data away from defective regions, thus reducing the possibility of additional data loss. It is determined whether the data decode/detection process (block 375) results in a data convergence (block 385). Where the data does converge (block 385), the data decode/detection process including recovery mode media defect detection (block 375) succeeded in correcting any errors introduced due to a media defect or any other noise. As such, the resulting data is provided as an output (block 390). Of note, the processes discussed in relation to blocks 305-390 are done online (i.e., during a standard data access to the storage medium). Where, on the other hand, the data does not converge (block 385), offline defect location and/or correction is performed (block 395).

It should be noted that there are a variety of reasons that the process may end up in the state represented by block 395. For example, the read process may have been off-track. Alternatively, there may not have been sufficient bandwidth to do a sufficient number of iterations. As another example, the process may have missed one or more media defects during online processing. As yet another example, the distortion factors (i.e., the estimated media defect amplitude represented as $\eta$ in FIG. 4 or the magnitude of programmable scalar 482) may not have been properly adjusted during online processing.

Figure 6:
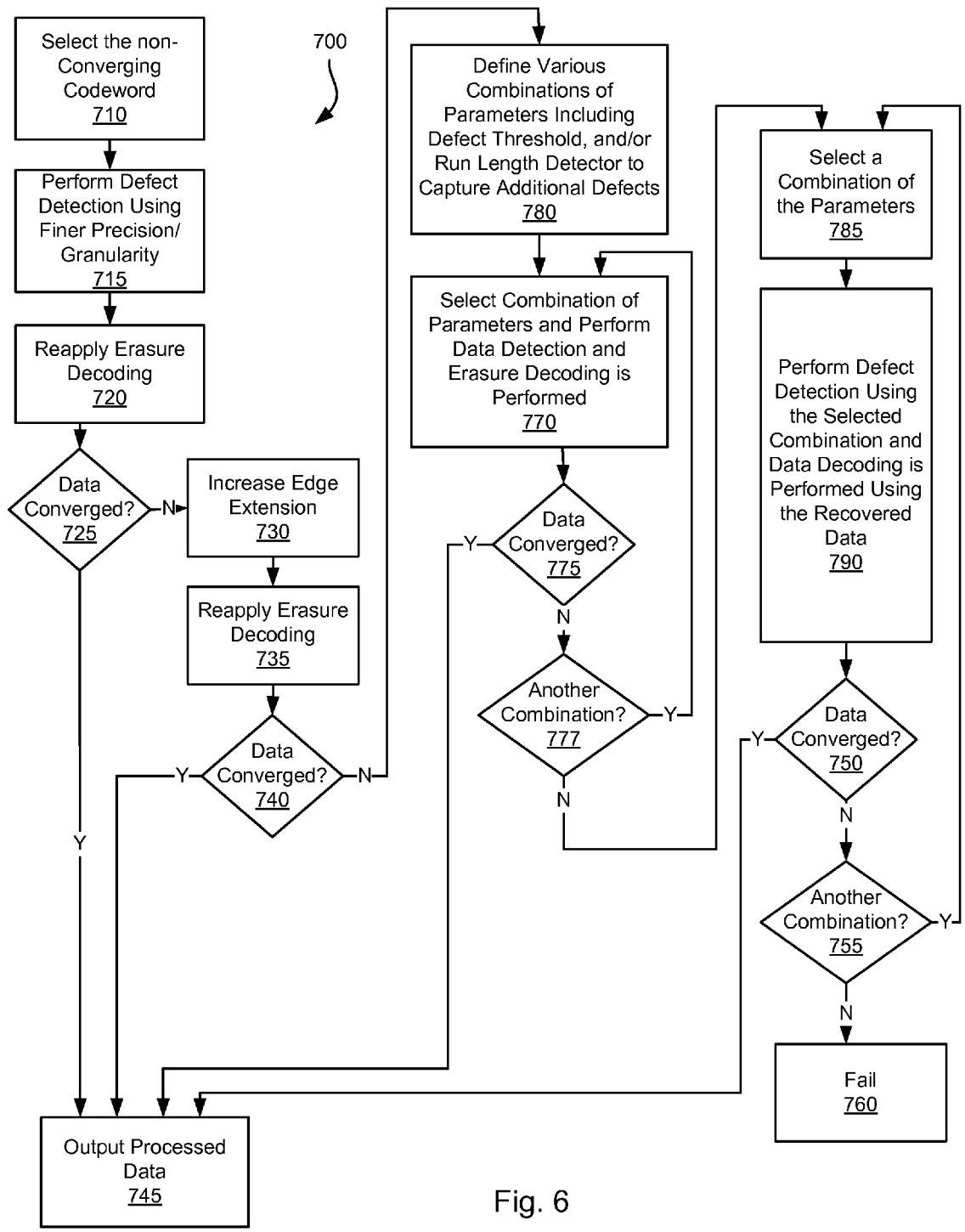
FIG. 6 is a flow diagram showing a multilevel offline or retry defect detection and correction process in accordance with various embodiments of the present invention.

Turning to FIG. 6, a flow diagram 700 shows an example of a multilevel offline or retry defect detection and correction process that may be used in place of block 395. The processes of flow diagram 700 may be repeated for a large number of iterations using different programmable factors, left and/or right extensions, run length threshold, and/or distortion factors. Following flow diagram 700, a non-converging codeword is selected (block 710). Processing of previously converged codewords around the non-converging codewords is not performed. Defect detection is performed using a finer precision/granularity for processing around the non-converging codeword (block 715). For example, threshold 693 of media defect detector 600 may be reduced such that smaller defective regions are detected. After performing detection with modified parameters (block 715), a data decode/detection process is performed with erasure mode media defect detection similar to that discussed above in relation to block 345 (block 720). It is then determined whether the data converged (block 725). Where the data does converge (block 725), the data decode/detection process succeeded in correcting any errors introduced due to a media defect or any other noise. As such, the resulting data is provided as an output (block 745). By changing the region around where the non-converging codeword was detected, the data decode/detection process has another opportunity to correct any errors due to a defective medium or other noise.

Alternatively, where the data failed to converge (block 725), left extension 694 and/or right extension 696 of media defect detector 600 may be increased or otherwise modified (block 730). Such modification may be used to provide erasure decoding on only a more central area of the defective region, or to extend erasure decoding to a greater area surrounding the detected media defect region. In addition to modifying the left extension and/or right extension, a data decode/detection process is performed with erasure mode media defect detection similar to that discussed above in relation to block 345 (block 730). After performing detection with modified edge extensions (block 730), a data decode/detection process is performed with erasure mode media defect detection similar to that discussed above in relation to block 345 (block 735). It is then determined whether the data converged (block 740). Where the data does converge (block 740), the data decode/detection process succeeded in correcting any errors introduced due to a media defect or any other noise. As such, the resulting data is provided as an output (block 745). By modifying the region around where the non-converging codeword was detected, the data decode/detection process has another opportunity to correct any errors due to a defective medium or other noise.

Alternatively, where the data failed to converge (block 740), a variety of combinations of parameters are identified for consideration (block 780). Such parameters may include, but are not limited to, the defect threshold, the threshold of the run length detector (e.g., threshold 693), edge extension controls (e.g., left extension 694 and right extension 696), programmable scalar (e.g., programmable scalar 482), attenuation factors (e.g., $\eta$ of FIG. 4) or the like. Combinations of such parameters may be pre-defined and maintained in a look-up table accessible by the device. One combination of the parameters is selected and erasure decoding is performed using the selected combination of parameters (block 770). Such processing may be the same as that discussed above as block 345. It is then determined whether the decoding process converged (block 775). Where the data does converge (block 775), the data decode/detection process succeeded in correcting any errors introduced due to a media defect or any other noise. As such, the resulting data is provided as an output (block 745). By performing recovery decoding on the non-converging codeword, the data decode/detection process has another opportunity to correct any errors due to a defective medium or other noise.

Where, on the other hand, the codeword failed to converge (block 775), it is determined whether there is another combination of parameters to be applied (block 777). Where there is another set of parameters (block 777), the processes of blocks 770 and 775 are repeated for the next combination of parameters. Alternatively, where there is not another set of parameters (block 755), the identified combination of parameters are used in recovered data processing. In particular, one of the combination of parameters is selected (block 785), and defect detection is performed using the selected combination to recover data, and data decoding is performed using the recovered data (block 790). Such processing may be the same as that discussed above as block 375. It is then determined whether the decoding process converged (block 750). Where the data does converge (block 750), the data decode/detection process succeeded in correcting any errors introduced due to a media defect or any other noise. As such, the resulting data is provided as an output (block 745). By performing recovery decoding using combinations of parameters, the data decode/ detection process has another opportunity to correct any errors due to a defective medium or other noise.

Where the data does not converge (block 750), it is determined whether there is another combination of parameters to be applied (block 755). Where there is another set of parameters (block 755), the processes of blocks 785, 790, 750 are repeated for the next combination of parameters. Alternatively, where there is not another set of parameters (block 755), the process fails (block 760).

Figure 7:
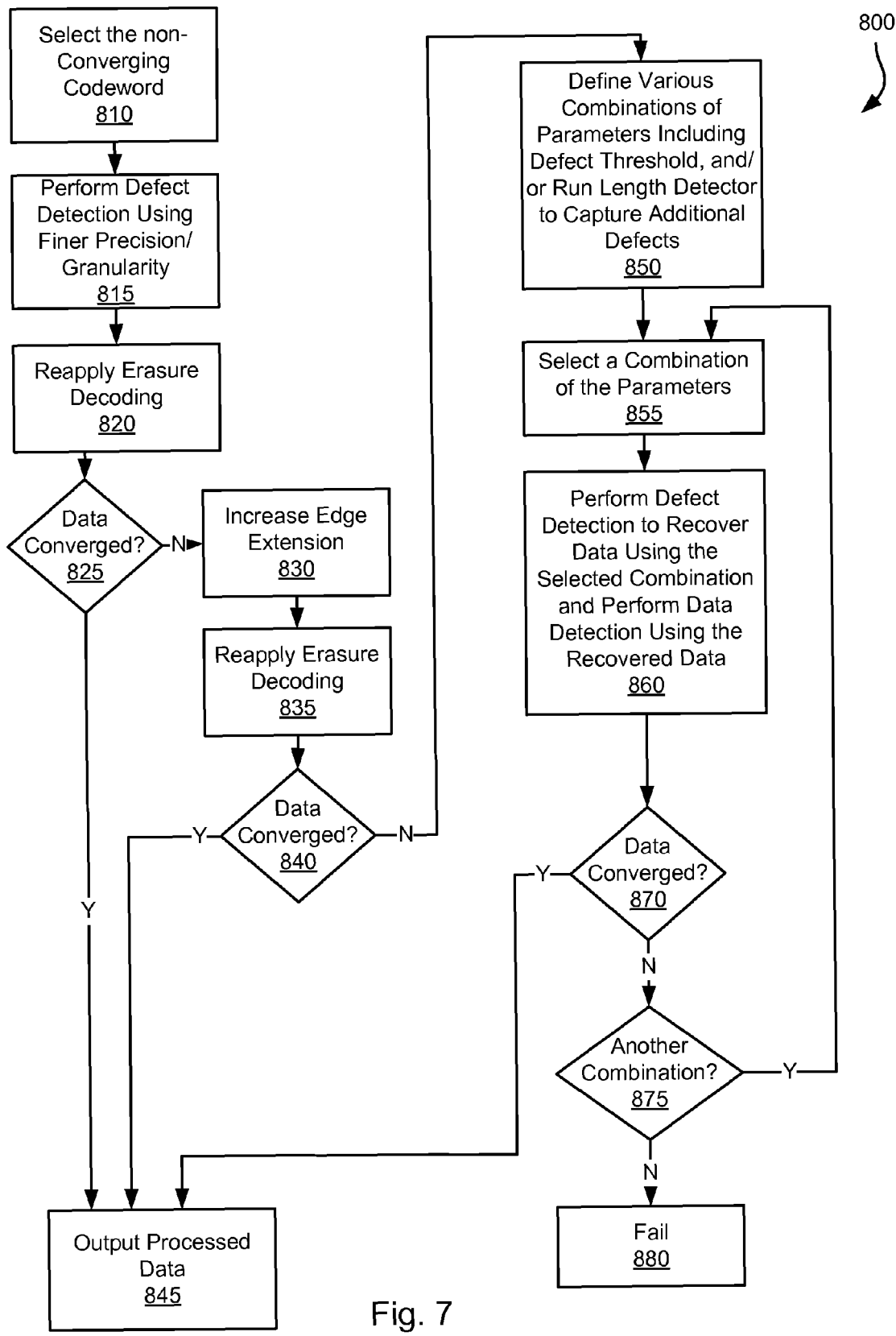
FIG. 7 is a flow diagram showing another multilevel offline or retry defect detection and correction process in accordance with various embodiments of the present invention.

FIG. 7 is a flow diagram 800 showing another multilevel offline or retry defect detection and correction process in accordance with various embodiments of the present invention. In some cases, the multilevel offline or retry defect detection and correction process that may be used in place of block 395. The processes of flow diagram 800 may be repeated for a large number of iterations using different programmable factors, left and/or right extensions, run length threshold, and/or distortion factors. Following flow diagram 800, a non-converging codeword is selected (block 810). Processing of previously converged codewords around the non-converging codewords is not performed. Defect detection is performed using a finer precision/granularity for processing around the non-converging codeword (block 815). For example, threshold 693 of media defect detector 600 may be increased such that smaller defective regions are detected. After performing detection with modified parameters (block 815), a data decode/detection process is performed with erasure mode media defect detection similar to that discussed above in relation to block 345 (block 820). It is then determined whether the data converged (block 825). Where the data does converge (block 825), the data decode/detection process succeeded in correcting any errors introduced due to a media defect or any other noise. As such, the resulting data is provided as an output (block 845). By changing the region around where the non-converging codeword was detected, the data decode/detection process has another opportunity to correct any errors due to a defective medium or other noise.

Alternatively, where the data failed to converge (block 825), left extension 694 and/or right extension 696 of media defect detector 600 may be increased or otherwise modified (block 830). Such modification may be used to provide erasure decoding on only a more central area of the defective region, or to extend erasure decoding to a greater area surrounding the detected media defect region. In addition to modifying the left extension and/or right extension, a data decode/detection process is performed with erasure mode media defect detection similar to that discussed above in relation to block 345 (block 830). After performing detection with modified edge extensions (block 830), a data decode/detection process is performed with erasure mode media defect detection similar to that discussed above in relation to block 345 (block 835). It is then determined whether the data converged (block 840). Where the data does converge (block 840), the data decode/detection process succeeded in correcting any errors introduced due to a media defect or any other noise. As such, the resulting data is provided as an output (block 845). By modifying the region around where the non-converging codeword was detected, the data decode/detection process has another opportunity to correct any errors due to a defective medium or other noise.

Alternatively, where the data failed to converge (block 840), a variety of combinations of parameters are identified for consideration (block 850). Such parameters may include, but are not limited to, the defect threshold, the threshold of the run length detector (e.g., threshold 693), edge extension controls (e.g., left extension 694 and right extension 696), programmable scalar (e.g., programmable scalar 482), attenuation factors (e.g., $\eta$ of FIG. 4) or the like. One of the combination of parameters is selected (block 855), and defect detection is performed using the selected combination to recover data and a data decoding process is applied using the recovered data (block 860). Such processing may be the same as that discussed above as block 375. It is then determined whether the decoding process converged (block 870). Where the data does converge (block 870), the data decode/detection process succeeded in correcting any errors introduced due to a media defect or any other noise. As such, the resulting data is provided as an output (block 845). Alternatively, where the data failed to converge (block 870), it is determined whether there is another combination of parameters to be applied (block 875). Where there is another set of parameters (block 870), the processes of blocks 855, 860, 870, 875 are repeated for the next combination of parameters. Alternatively, where there is not another set of parameters (block 875), the process fails (block 880). By performing recovery decoding using combinations of parameters, the data decode/detection process has another opportunity to correct any errors due to a defective medium or other noise.

Figure 8:
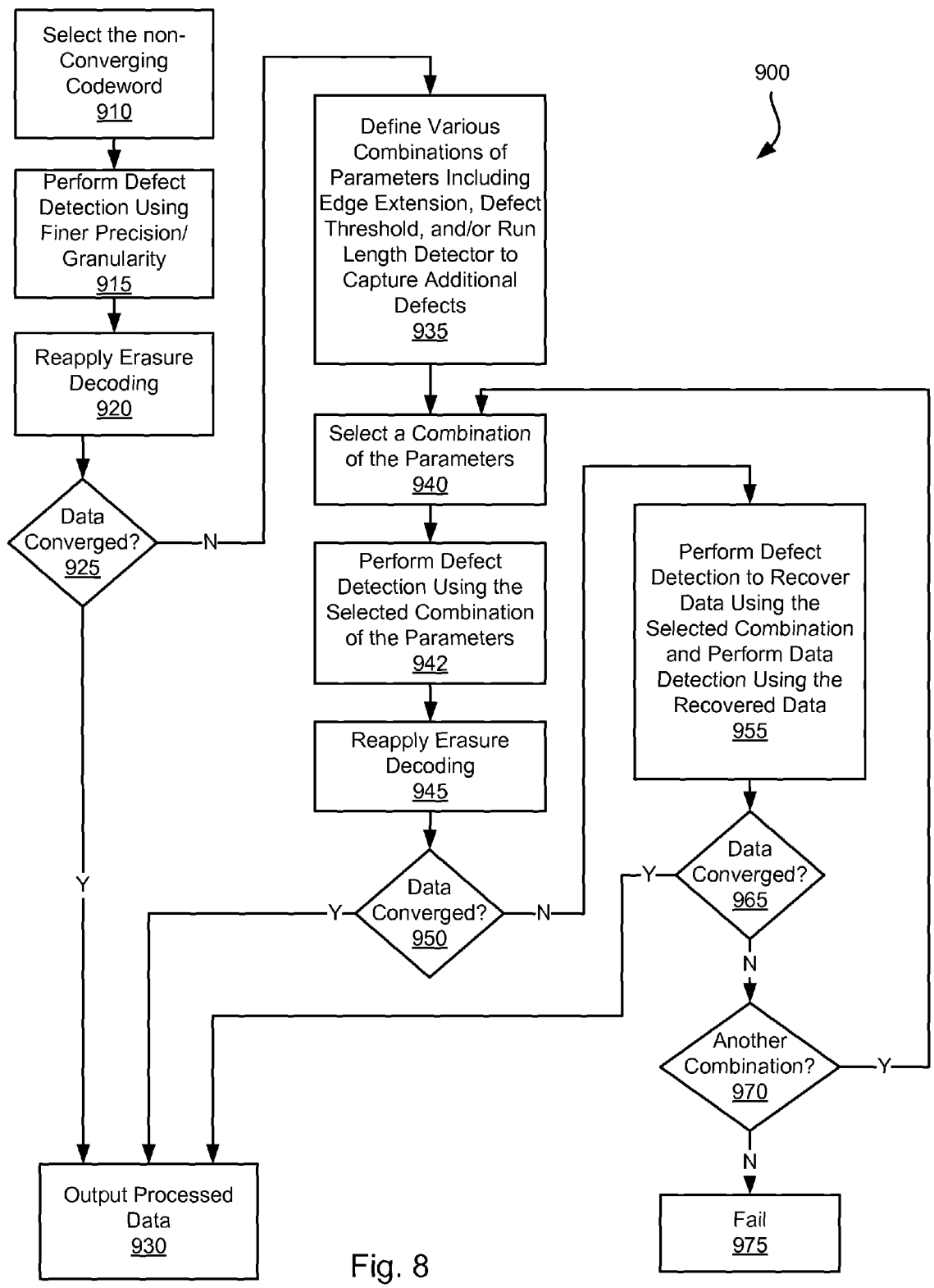
FIG. 8 is a flow diagram showing yet another multilevel offline or retry defect detection and correction process in accordance with various embodiments of the present invention.

FIG. 8 is a flow diagram 900 showing yet another multilevel offline or retry defect detection and correction process in accordance with various embodiments of the present invention. In some cases, the multilevel offline or retry defect detection and correction process that may be used in place of block 395. The processes of flow diagram 900 may be repeated for a large number of iterations using different programmable factors, left and/or right extensions, run length threshold, and/or distortion factors. Following flow diagram 900, a non-converging codeword is selected (block 910). Processing of previously converged codewords around the non-converging codewords is not performed. Defect detection is performed using a finer precision/granularity for processing around the non-converging codeword (block 915). For example, threshold 693 of media defect detector 600 may be reduced such that smaller defective regions are detected. After performing detection with modified parameters (block 915), a data decode/detection process is performed with erasure mode media defect detection similar to that discussed above in relation to block 345 (block 920). It is then determined whether the data converged (block 925). Where the data does converge (block 925), the data decode/detection process succeeded in correcting any errors introduced due to a media defect or any other noise. As such, the resulting data is provided as an output (block 930). By changing the region around where the non-converging codeword was detected, the data decode/detection process has another opportunity to correct any errors due to a defective medium or other noise.

Alternatively, where the data failed to converge (block 925), a variety of combinations of parameters are identified for consideration (block 935). Such parameters may include, but are not limited to, changes in the left extension 694 and/or right extension 696 of media defect detector 600, the defect threshold, the threshold of the run length detector (e.g., threshold 693), edge extension controls (e.g., left extension 694 and right extension 696), programmable scalar (e.g., programmable scalar 482), attenuation factors (e.g., $\eta$ of FIG. 4) or the like. One of the combination of parameters is selected (block 940), and defect detection is performed using the selected combination (block 942). Erasure decoding is then applied during a decoding process (block 945). It is then determined whether the data converged (block 950). Where the data failed to converge (block 950), defect detection is performed using the selected combination to recover data and a data decoding process is applied using the recovered data (block 955). Such processing may be the same as that discussed above as block 375. It is then determined whether the decoding process converged (block 965). Alternatively, where the data failed to converge (block 965), it is determined whether there is another combination of parameters to be applied (block 970). Where there is another set of parameters (block 970), the processes of blocks 940, 942, 945, 950, 955, 965, 970 are repeated for the next combination of parameters. Alternatively, where there is not another set of parameters (block 970), the process fails (block 975). By performing recovery decoding using combinations of parameters, the data decode/detection process has another opportunity to correct any errors due to a defective medium or other noise.

In conclusion, the invention provides novel systems, devices, methods and arrangements for identifying defective regions on storage mediums and correcting data errors associated with such defective regions. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for deriving data from a defective media region, the method comprising:
   providing a storage medium;
   performing a media defect detection, wherein the media defect detection yields an indication of a defective region on the storage medium;
   performing a first data decode on data corresponding to the defective region, wherein the first data decode yields a first output;
   determining that the first output failed to converge; and
   based at least in part on a combination of the failure of the first output to converge and the indication of the defective region, performing a second data decode on the data corresponding to the defective region, wherein the second data decode includes zeroing out any soft data corresponding to the defective region and providing a second output.

2. The method of claim 1, wherein the method further comprises:
   determining that the second output failed to converge; and
   based at least in part on the failure of the second output to converge, performing a third data decode on the data corresponding to the defective region, wherein the third data decode includes using data regenerated from data corresponding to the defective region and providing a third output.

3. The method of claim 2, wherein the method further comprises:
   determining that the third output failed to converge; and
   based at least in part on the failure of the third output to converge, performing an offline detection and decode process to recover the data corresponding to the defective region.

4. The method of claim 3, wherein the offline detection and decode process includes modifying one or more parameters associated with performing the media defect detection, and performing a fourth data decode on the data corresponding to the defective region using the modified parameters.

5. The method of claim 4, wherein the fourth data decode includes zeroing out any soft data corresponding to the defective region.

6. The method of claim 4, wherein the fourth data decode includes using data regenerated from data corresponding to the defective region.

7. The method of claim 4, wherein the parameters associated with performing the media defect detection are selected from a group consisting of: a defect amplitude threshold, a run length threshold, a left extension value and a right extension value.

8. The method of claim 3, wherein the offline detection and decode process includes modifying one or more parameters associated with performing the third data decode, and performing a fourth data decode on the data corresponding to the defective region using the modified parameters.

9. The method of claim 8, wherein the parameters associated with performing the third data decode are selected from a group consisting of: an attenuation factor and a programmable scalar.

10. The method of claim 8, wherein the fourth data decode includes a process selected from the group consisting of: zeroing out any soft data corresponding to the defective region, and using data regenerated from data corresponding to the defective region.

11. A method for deriving data from a defective media region, the system comprising:
    providing a storage medium;
    performing a media defect detection, wherein the media defect detection yields an indication of a defective region on the storage medium;
    performing a first data decode on data corresponding to the defective region, wherein the first data decode includes zeroing out any soft data corresponding to the defective region and providing a first output;
    determining that the first output failed to converge; and
    based at least in part on a combination of the failure of the first output to converge and the indication of the defective region, performing a second data decode on the data corresponding to the defective region, wherein the second data decode includes regenerating data corresponding to the defective region and providing a second output.

12. The method of claim 11, wherein the method further comprises:
    determining that the second output failed to converge; and
    based at least in part on the failure of the second output to converge, performing an offline detection and decode process to recover the data corresponding to the defective region.

13. The method of claim 11, wherein the offline detection and decode process includes modifying one or more parameters associated with performing the first data decode, and performing a third data decode on the data corresponding to the defective region using the modified parameters.

14. The method of claim 13, wherein the parameters associated with performing the third data decode are selected from a group consisting of: an attenuation factor and a programmable scalar.

15. The method of claim 11, wherein the method further comprises:
    performing a third data decode on data corresponding to the defective region, wherein the third data decode yields a third output;
    determining that the third output failed to converge; and
    wherein performing the first data decode is done at least in part based upon the failure of the third output to converge.

16. A method for deriving data from a defective media region, the system comprising:
- providing a storage medium;
- performing a media defect detection, wherein the media defect detection yields an indication of a defective region on the storage medium;
- based on the indication of the defective region, performing a first data decode on data corresponding to the defective region, wherein the first data decode includes regenerating data corresponding to the defective region and providing a first output;
- determining that the first output failed to converge; and
- based at least in part on the failure of the first output to converge, performing an offline detection and decode process to recover the data corresponding to the defective region.

17. The method of claim 16, wherein the method further comprises:
- performing a second data decode on data corresponding to the defective region, wherein the second data decode yields a second output;
- determining that the second output failed to converge; and
- wherein performing the first data decode is done at least in part based upon the failure of the second output to converge.

18. The method of claim 16, wherein the method further comprises:
- performing a second data decode on data corresponding to the defective region, wherein the second data decode includes zeroing out any soft data corresponding to the defective region and providing a second output;
- determining that the second output failed to converge; and
- wherein performing the first data decode is done at least in part based upon the failure of the second output to converge.

19. The method of claim 16, wherein the offline detection and decode process includes modifying one or more parameters associated with performing the media defect detection, and performing a second data decode on the data corresponding to the defective region using the modified parameters.

20. The method of claim 19, wherein the parameters associated with performing the media defect detection are selected from a group consisting of: a defect amplitude threshold, a run length threshold, a left extension value and a right extension value.

21. A system for data processing, the system comprising:
- a media defect detector circuit operable to identify a defective region on a storage medium and to provide an indication of the defective region;
- a first data decode circuit operable to apply a data decode algorithm to a data set derived from the defective region of the storage medium to yield a first output; and
- a second data decode circuit operable to apply the data decode algorithm to the data set derived from the defective region of the storage medium to yield a second output, wherein the second data decode circuit is operable to zero out any soft data corresponding to the defective region prior to applying the data decode algorithm based on a combination of the failure of the first output to converge and the indication of the defective region.

22. The system of claim 21, wherein the system is implemented as part of an integrated circuit.

23. The system of claim 21, wherein the second data decode circuit operable to re-apply the data decode algorithm to the data set derived from the from the defective region of the storage medium using data regenerated from the data set derived form the defective region to yield a third output.

* * * * *